United States Patent
Villarreal et al.

(10) Patent No.: US 6,821,561 B2
(45) Date of Patent: Nov. 23, 2004

(54) METHOD FOR THIN FILM DEPOSITION MATCHING RATE OF EXPANSION OF SHADOW MASK TO RATE OF EXPANSION OF SUBSTRATE

(75) Inventors: Javier Villarreal, Cambridge, MA (US); Susan A. Alie, Stoneham, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/106,385

(22) Filed: Mar. 26, 2002

(65) Prior Publication Data

US 2003/0185976 A1 Oct. 2, 2003

(51) Int. Cl.$^7$ ............................................. C23C 14/04
(52) U.S. Cl. ................................... 427/248.1; 427/282
(58) Field of Search ............................... 427/248.1, 282

(56) References Cited

U.S. PATENT DOCUMENTS 5,154,797 A * 10/1992 Blomquist et al. ............ 216/12
6,057,168 A * 5/2000 Seyama et al. ............ 438/616
6,448,710 B1 * 9/2002 Asai et al. .................. 313/504

FOREIGN PATENT DOCUMENTS

JP       61084366 A  *  4/1986   ........... C23C/14/04
JP       61295366 A  * 12/1986   ........... C23C/14/04

* cited by examiner

*Primary Examiner*—Timothy Meeks
(74) *Attorney, Agent, or Firm*—Bromberg & Sunstein LLP

(57) ABSTRACT

A shadow mask material is selected so that the expansion characteristics of the shadow mask during thin film deposition closely match the expansion characteristics of the substrate. The shadow mask material is typically one with a low coefficient of thermal expansion (CTE). The shadow mask material must typically meet additional criteria, such as mechanical strength, feature quality, and dimensional accuracy criteria.

4 Claims, 2 Drawing Sheets

METHOD FOR THIN FILM DEPOSITION MATCHING RATE OF EXPANSION OF SHADOW MASK TO RATE OF EXPANSION OF SUBSTRATE

FIELD OF THE INVENTION

The present invention relates generally to thin film deposition technology, and more particularly to thin film deposition using a shadow mask.

BACKGROUND OF THE INVENTION

Thin films are used in a variety of applications. For example, thin films are often used in the production of Micro-Electromechanical Systems (MEMS) and Micro-Opto-Electromechanical Systems (MOEMS). In such applications, one or more thin film layers are typically applied to a substrate, such as a silicon or polysilicon wafer. The thin film layers can be used to form various electrical, mechanical, and optical features on the substrate.

One technique for depositing thin films uses a shadow mask to control the deposition of a thin film material onto the substrate. Specifically, various openings are formed in the shadow mask corresponding to various features to be applied to the substrate. The shadow mask is typically made from stainless steel, nickel, or copper, and may include multiple material layers (e.g., a thick material layer for defining gross features and a thinner material layer for defining fine features). The various openings may be formed in the shadow mask, for example, using a photochemical etching process. The shadow mask is placed in front of the substrate, typically within a vacuum chamber. The shadow mask and substrate are then exposed to vaporized thin film material, which is at extremely high temperature. The vaporized thin film material is deposited onto the substrate only where the substrate is exposed through the openings in the shadow mask, essentially in a "line of sight" from the source of the vaporized thin film material.

When exposed to the high-temperature vaporized thin film material, both the shadow mask and the substrate tend to expand due to thermal expansion. The shadow mask tends to expand faster than the substrate. One reason for this is that the shadow mask material typically has a higher coefficient of thermal expansion than the substrate material. Another reason for this is that the shadow mask typically heats up faster than the substrate, both from the heat of the vaporized material and from radiant heat, due to its placement in front of the substrate.

As the shadow mask expands, the shadow mask openings move relative to the substrate. The amount of movement of a particular opening depends upon its distance from the center of the shadow mask, with the amount of movement tending to increase as the distance from the center increases. FIG. 1 demonstrates this position-dependent movement of the openings in an exemplary shadow mask 100, where the center opening is substantially unaffected but the four openings at the periphery of the shadow mask move outward from the center. This expansion of the shadow mask relative to the substrate tends to cause "drifting" or "run out" of the various features deposited on the substrate, which can cause, among other things, uneven deposition of the thin film material and misshapen features, and can limit the size and proximity of the various features.

SUMMARY OF THE INVENTION

In accordance with one aspect of the invention, the shadow mask material is selected so that the expansion characteristics of the shadow mask during thin film deposition closely match the expansion characteristics of the substrate. The shadow mask material is typically one with a low coefficient of thermal expansion (CTE), in part because the substrate typically does not expand greatly during the thin film deposition. The shadow mask material must typically meet additional criteria, such as mechanical strength, feature quality, and dimensional accuracy criteria.

In accordance with another aspect of the invention, a method for thin film deposition involves providing a shadow mask material having expansion characteristics that closely match expansion characteristics of a substrate during a thin film deposition process, forming a shadow mask from the shadow mask material, and using the shadow mask to deposit a thin film material on the substrate using the thin film deposition process. The shadow mask material typically has a low coefficient of thermal expansion, and typically also has sufficient mechanical strength, feature quality, and dimensional accuracy characteristics. The shadow mask material may be a nickel alloy material such as INVAR(TM) or KOVAR(TM), silicon, or any of a variety of metals such as tungsten, molybdenum, zirconium, hafnium, rhenium, tantalum, iridium, and ruthenium. Forming the shadow mask typically involves forming openings in the shadow mask corresponding to various features to be applied to the substrate through a process of thin film deposition. Using the shadow mask to deposit a thin film material on the substrate using the thin film deposition process typically involves placing the shadow mask in front of the substrate and exposing the shadow mask and substrate to a vaporized thin film material.

In accordance with another aspect of the invention, a shadow mask for thin film deposition includes a material having expansion characteristics that closely match expansion characteristics of a substrate during a thin film deposition process and at least one opening formed in the material corresponding to at least one feature to be applied to the substrate during the thin film deposition process. The material typically has a low coefficient of thermal expansion, and typically also has sufficient mechanical strength, feature quality, and dimensional accuracy characteristics. The material may be a nickel alloy material such as INVAR(TM) or KOVAR(TM), silicon, or any of a variety of metals such as tungsten, molybdenum, zirconium, hafnium, rhenium, tantalum, iridium, and ruthenium.

In accordance with another aspect of the invention, a product is formed by the process of forming a shadow mask from a shadow mask material having expansion characteristics that closely match expansion characteristics of a substrate during a thin film deposition process, placing the shadow mask in front of the substrate, and exposing the shadow mask and substrate to a vaporized thin film material as part of the thin film deposition process. The product may be a MEMS product or a MOEMS product.

DETAILED DESCRIPTION OF A PREFERRED EMBODIMENT

In an embodiment of the present invention, the shadow mask material is selected so that the expansion characteristics of the shadow mask during thin film deposition closely match the expansion characteristics of the substrate. The shadow mask material is typically one with a low coefficient of thermal expansion (CTE), in part because the substrate typically does not expand greatly during the thin film deposition. The shadow mask material must typically meet additional criteria, such as mechanical strength, feature quality, and dimensional accuracy criteria.

It should be noted that it is not necessarily sufficient to select shadow mask material having the same CTE as that of the substrate, since the shadow mask is heated at a different rate than the substrate during the thin film deposition process. Thus, even if the shadow mask and the substrate have the same CTE, the shadow mask will generally expand faster and to a greater degree than the substrate.

One class of candidate materials for a shadow mask includes various nickel alloys having a low CTE. Specific examples include nickel alloys known as INVAR(TM) and KOVAR(TM).

Another candidate material for a shadow mask is silicon.

Yet another class of candidate materials for a shadow mask includes various metals having a CTE under 6.5. These metals include tungsten, molybdenum, zirconium, hafnium, rhenium, tantalum, iridium, and ruthenium, to name but a few.

Once a candidate shadow mask material is selected, a shadow mask is formed from the material. Specifically, various openings are formed in the shadow mask corresponding to various features to be applied to the substrate. The shadow mask may include multiple material layers (e.g., a thick material layer for defining gross features and a thinner material layer for defining fine features). The various openings may be formed in the shadow mask, for example, using a photochemical etching process.

Once the shadow mask is formed, the shadow mask can be used to deposit a thin film material on the substrate. Specifically, the shadow mask is placed in front of the substrate, typically within a vacuum chamber. The shadow mask and substrate are then exposed to vaporized thin film material, which is at extremely high temperature. The vaporized thin film material is deposited onto the substrate only where the substrate is exposed through the openings in the shadow mask, essentially in a "line of sight" from the source of the vaporized thin film material.

Figure 1:
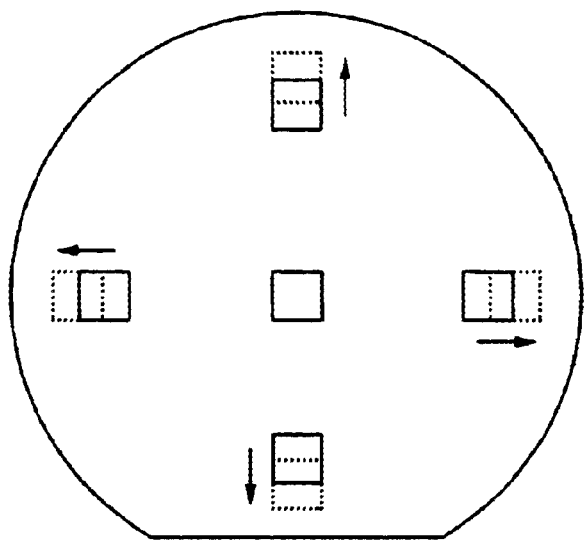
FIG. 1 demonstrates the position-dependent movement of the openings in an exemplary shadow mask as known in the art.
Figure 2:
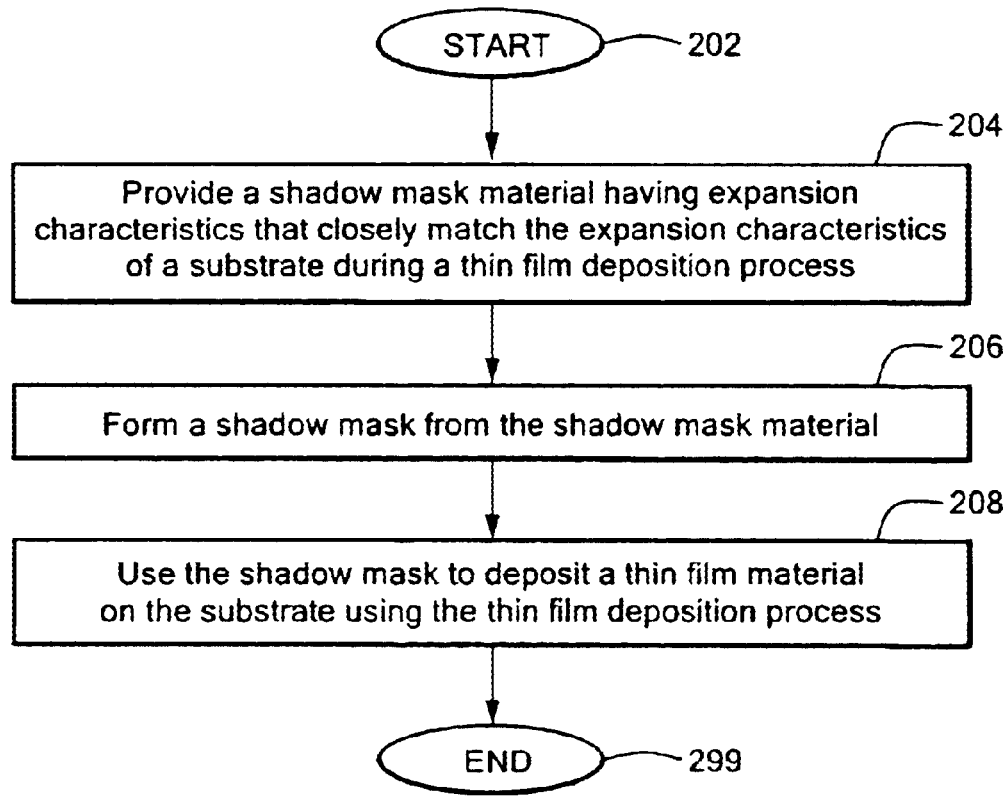
FIG. 2 describes a thin film deposition method in accordance with an embodiment of the present invention.

FIG. 2 describes a thin film deposition method 200 in accordance with an embodiment of the present invention. Beginning in block 202, the method involves providing a shadow mask material having expansion characteristics that closely match the expansion characteristics of the substrate during a thin film deposition process, in block 204, forming a shadow mask from the shadow mask material, in block 206, and using the shadow mask to deposit a thin film material on the substrate using the thin film deposition process, in block 208. The thin film deposition process typically involves placing the shadow mask in front of the substrate and exposing the shadow mask and substrate to a vaporized thin film material. The method terminates in block 299.

Figure 3:
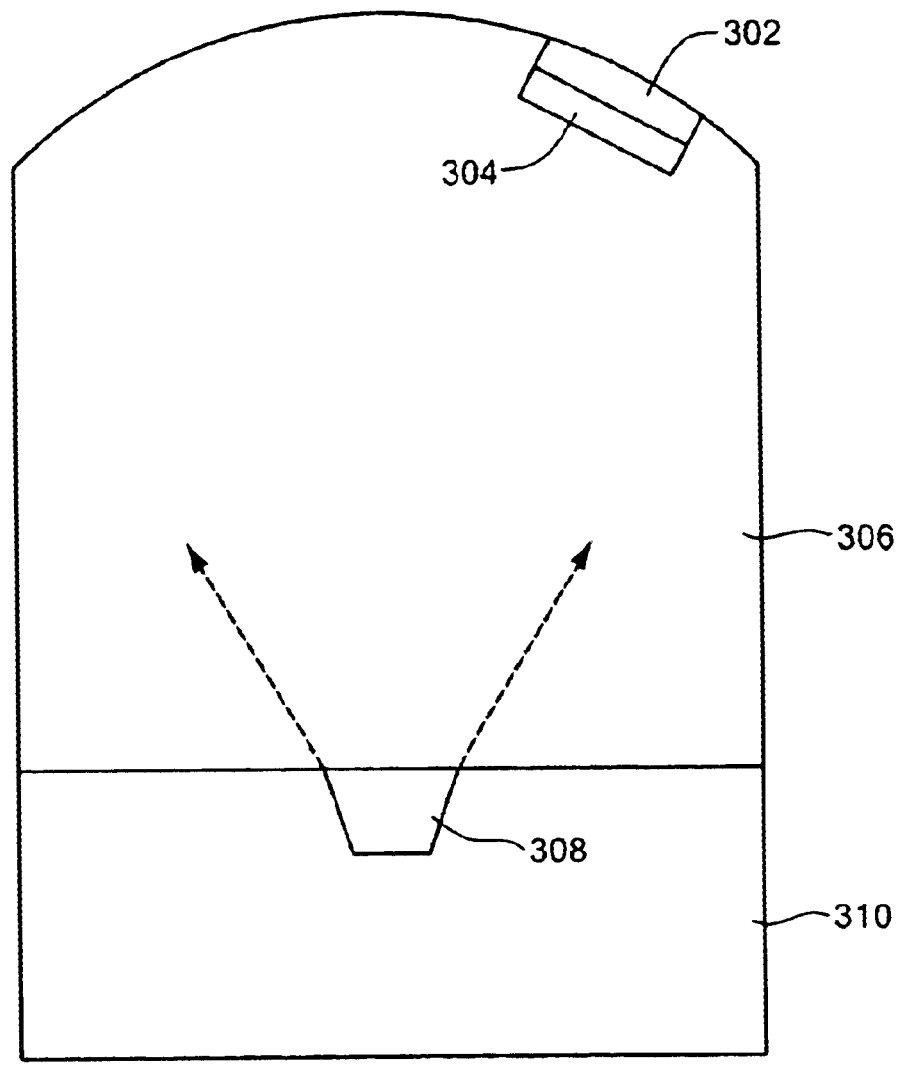
FIG. 3 shows a thin film deposition configuration in accordance with an embodiment of the present invention.

FIG. 3 shows a thin film deposition configuration 300 in accordance with an embodiment of the present invention. A shadow mask 304, which has expansion characteristics that closely match expansion characteristics of a substrate during a thin film deposition process, is placed in front of a substrate 302 within a vacuum chamber 306. A vessel 308 containing the thin film material to be applied to the substrate 302 is placed within an oven 310 adjacent to the vacuum chamber 306. The vessel 308 is heated within the oven 310 at least until the thin film material vaporizes. This is usually done without exposing the vessel 308 or the thin film material contained therein to the vacuum chamber 306. After the thin film material vaporizes, the vaporized thin film material is exposed to the vacuum chamber 306 and begins filling the vacuum chamber 306. The vaporized thin film material is deposited on the substrate 302 only where the substrate 302 is exposed through the shadow mask 304. By virtue of the material selected for the shadow mask 304, expansion of the shadow mask relative to the substrate is reduced, and therefore "drifting" or "run out" of the various features deposited on the substrate is reduced.

Thus, a process of forming a shadow mask from a shadow mask material having expansion characteristics that closely match expansion characteristics of a substrate during a thin film deposition process, placing the shadow mask in front of the substrate, and exposing the shadow mask and substrate to a vaporized thin film material as part of the thin film deposition process typically produces a product, such as a MEMS or MOEMS, that has a more evenly deposited thin film with correctly shaped and positioned features. Such a product is to be considered an embodiment of the present invention.

The present invention may be embodied in other specific forms without departing from the true scope of the invention. The described embodiments are to be considered in all respects only as illustrative and not restrictive.

What is claimed is:

1. A method for thin film deposition, the method comprising:
    providing a substrate made from a first selected material having a first coefficient of thermal expansion:
    providing a shadow mask made from a second selected material having a second coefficient of thermal expansion different than the first coefficient of thermal expansion; and
    using the shadow mask to deposit a thin film material on the substrate using a thin film deposition process, wherein the shadow mask is heated at a first rate and the substrate is heated at a second rate different than the first rate during the thin film deposition process, and wherein the substrate material is selected such that, during the thin film deposition process, a rate of expansion of the shadow mask when heated at the first rate is substantially equal to a rate of expansion of the substrate when heated at the second rate.

2. The method of claim 1, wherein the shadow mask comprises:
    openings corresponding to various features to be applied to the substrate.

3. The method of claim 1, wherein using the shadow mask to deposit a thin film material on the substrate using the thin film deposition process comprises:
    placing the shadow mask in front of the substrate relative to a source of heated vaporized thin film material; and
    exposing the shadow mask and substrate to the heated vaporized thin film material, said exposing causing the shadow mask to heat at a faster rate than the substrate.

4. The method of claim 1, wherein the shadow mask is heated at a fast rate than the substrate during the thin film deposition process, and wherein the shadow mask material has a lower coefficient of thermal expansion than the substrate.

* * * * *